(12) United States Patent
Yuan et al.

(10) Patent No.: US 11,778,880 B2
(45) Date of Patent: *Oct. 3, 2023

(54) DISPLAY SUBSTRATE AND MANUFACTURING METHOD THEREOF, DISPLAY PANEL AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Zhidong Yuan, Beijing (CN); Pan Xu, Beijing (CN); Can Yuan, Beijing (CN); Meng Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 73 days.

This patent is subject to a terminal disclaimer.

(21) Appl. No.: 17/307,573

(22) Filed: May 4, 2021

(65) Prior Publication Data

US 2021/0257417 A1 Aug. 19, 2021

Related U.S. Application Data

(63) Continuation of application No. 16/335,972, filed as application No. PCT/CN2018/092399 on Jun. 22, 2018, now Pat. No. 11,031,437.

(30) Foreign Application Priority Data

Jun. 26, 2017 (CN) .......................... 201710494463.1

(51) Int. Cl.
*H10K 59/35* (2023.01)
*H10K 71/00* (2023.01)
(Continued)

(52) U.S. Cl.
CPC ............. *H10K 59/35* (2023.02); *H10K 71/00* (2023.02); *H10K 59/12* (2023.02); *H10K 59/38* (2023.02)

(58) Field of Classification Search
CPC ........ H10K 59/35; H10K 71/00; H10K 59/12; H10K 59/38
See application file for complete search history.

(56) References Cited

U.S. PATENT DOCUMENTS 6,137,100 A * 10/2000 Fossum ............. H01L 27/14645
348/277
6,147,730 A * 11/2000 Budd ..................... G02B 5/201
349/108
(Continued)

FOREIGN PATENT DOCUMENTS

CN 1776467 A 5/2006
CN 101060130 A 10/2007
(Continued)

OTHER PUBLICATIONS

Sep. 25, 2018—(WO) International Search Report and the Written Opinion Appn PCT/CN2018/092399 with English Translation.

*Primary Examiner* — Mohammed Shamsuzzaman
(74) *Attorney, Agent, or Firm* — Banner & Witcoff, Ltd.

(57) ABSTRACT

A display substrate and a fabrication method thereof, a display panel and a display device are provided. The display substrate includes pixels. Each of the pixels includes sub-pixels that emit light of different colors, each of the sub-pixels includes a light emitting element, and at least one of the sub-pixels further includes a color filter. The color filter of the at least one of the sub-pixels covers a portion of a light emitting region of the light emitting element of the at least one of the sub-pixels, and a color of the color filter of the at
(Continued)

least one of the sub-pixels is the same as a color of light emitted by the light emitting element of the at least one of the sub-pixels.

17 Claims, 8 Drawing Sheets

(51) Int. Cl.
*H10K 59/12* (2023.01)
*H10K 59/38* (2023.01)

(56) References Cited

U.S. PATENT DOCUMENTS

| | | | | |
|---|---|---|---|---|
| 6,624,860 | B1* | 9/2003 | Narutaki | G02F 1/133555 349/114 |
| 6,911,772 | B2* | 6/2005 | Cok | H10K 59/38 313/506 |
| 7,741,770 | B2* | 6/2010 | Cok | H10K 59/38 313/503 |
| 7,851,992 | B2* | 12/2010 | Lee | H10K 50/852 313/506 |
| 7,876,404 | B2 | 1/2011 | Hwang | |
| 8,242,687 | B2 | 8/2012 | Kanatani et al. | |
| 8,502,445 | B2 | 8/2013 | Levermore et al. | |
| 8,748,876 | B2* | 6/2014 | Sasaki | H10K 59/30 257/E33.072 |
| 8,749,737 | B2* | 6/2014 | Chen | G02F 1/133514 349/110 |
| 9,087,797 | B2* | 7/2015 | Uetake | H10K 59/351 |
| 9,287,332 | B2* | 3/2016 | Hatano | H10K 50/852 |
| 9,362,342 | B2* | 6/2016 | Ono | H10K 59/38 |
| 9,793,326 | B2* | 10/2017 | Yun | H01L 33/508 |
| 9,935,157 | B2 | 4/2018 | Tang | |
| 10,141,379 | B2* | 11/2018 | Kim | H10K 50/86 |
| 10,170,521 | B2* | 1/2019 | Jung | H10K 50/852 |
| 10,222,640 | B2* | 3/2019 | Zhao | G02F 1/133512 |
| 10,483,330 | B2* | 11/2019 | Ota | H10K 59/126 |
| 10,833,229 | B2* | 11/2020 | Choi | G02B 5/201 |
| 10,873,057 | B2* | 12/2020 | Youn | H10K 50/19 |
| 11,138,930 | B2* | 10/2021 | Yu | H10K 59/352 |
| 2002/0126238 | A1* | 9/2002 | Matsushita | G02F 1/133555 349/106 |
| 2003/0025977 | A1* | 2/2003 | Takizawa | G02F 1/133555 359/253 |
| 2003/0063244 | A1* | 4/2003 | Fujimori | G02F 1/133553 349/113 |
| 2003/0117551 | A1* | 6/2003 | Fujimori | G02F 1/133553 349/113 |
| 2004/0095528 | A1* | 5/2004 | Nakamura | G02F 1/133514 349/114 |
| 2004/0183990 | A1* | 9/2004 | Guang | G02F 1/13394 349/155 |
| 2004/0196421 | A1* | 10/2004 | Hwang | G02F 1/13394 349/114 |
| 2005/0110923 | A1* | 5/2005 | Yamashita | G02B 5/223 349/114 |
| 2005/0225237 | A1* | 10/2005 | Winters | H10K 50/852 313/506 |
| 2006/0119770 | A1* | 6/2006 | Ting | G02F 1/133555 349/114 |
| 2006/0268138 | A1* | 11/2006 | Higashitsutsumi | H04N 23/843 348/208.99 |
| 2006/0290872 | A1* | 12/2006 | Morii | G02F 1/13394 349/114 |
| 2007/0222354 | A1* | 9/2007 | Chen | H01J 31/127 313/496 |
| 2008/0068533 | A1* | 3/2008 | Yun | G02F 1/133514 349/68 |
| 2008/0218070 | A1* | 9/2008 | Kobayashi | H10K 50/852 313/506 |
| 2008/0231777 | A1* | 9/2008 | Iijima | G02F 1/133514 349/106 |
| 2008/0316401 | A1* | 12/2008 | Chang | G02F 1/133555 349/114 |
| 2009/0128752 | A1* | 5/2009 | Itou | G02B 5/201 349/114 |
| 2009/0141381 | A1* | 6/2009 | Itou | G02B 5/201 359/891 |
| 2009/0284699 | A1* | 11/2009 | Hwang | G02F 1/133555 349/114 |
| 2010/0231614 | A1* | 9/2010 | Vieri | G09G 3/3677 345/690 |
| 2011/0057210 | A1* | 3/2011 | Sonoda | H10K 50/858 257/E33.073 |
| 2011/0284898 | A1* | 11/2011 | Iwasaki | H10K 59/38 257/98 |
| 2012/0025699 | A1* | 2/2012 | Okumoto | H10K 50/865 313/506 |
| 2012/0099054 | A1* | 4/2012 | Takeuchi | H10K 50/86 349/98 |
| 2012/0206675 | A1* | 8/2012 | Seo | H05B 33/22 257/E33.072 |
| 2013/0020934 | A1* | 1/2013 | Iwasaki | H10K 59/38 313/504 |
| 2014/0117334 | A1* | 5/2014 | Nakamura | H10K 50/841 257/40 |
| 2014/0158994 | A1* | 6/2014 | Kim | H10K 50/828 257/40 |
| 2015/0001576 | A1* | 1/2015 | Iwata | H10K 50/858 438/26 |
| 2015/0014655 | A1* | 1/2015 | Yun | H10K 59/38 257/40 |
| 2015/0153596 | A1* | 6/2015 | Senokuchi | H05B 33/04 445/25 |
| 2015/0187989 | A1 | 7/2015 | Sato | |
| 2016/0155789 | A1* | 6/2016 | Kim | H10K 50/86 257/40 |
| 2016/0181532 | A1* | 6/2016 | Ando | H10K 50/13 438/46 |
| 2016/0190218 | A1* | 6/2016 | Jeong | H10K 50/822 257/40 |
| 2016/0233274 | A1* | 8/2016 | Park | H10K 59/50 |
| 2016/0293676 | A1* | 10/2016 | Komatsu | H10K 71/16 |
| 2016/0320643 | A1* | 11/2016 | Lee | H10K 71/00 |
| 2016/0365397 | A1* | 12/2016 | Seo | H10K 59/38 |
| 2017/0102580 | A1* | 4/2017 | Wang | G02F 1/133514 |
| 2017/0123268 | A1* | 5/2017 | Sasaki | H01L 27/15 |
| 2017/0213850 | A1* | 7/2017 | Dong | G02B 5/201 |
| 2017/0243930 | A1* | 8/2017 | Kondo | H10K 59/122 |
| 2017/0250240 | A1* | 8/2017 | Lee | H01L 27/124 |
| 2017/0294610 | A1* | 10/2017 | Sasaki | H10K 59/131 |
| 2017/0338289 | A1* | 11/2017 | Seo | H10K 59/35 |
| 2017/0343859 | A1* | 11/2017 | Chen | G02B 5/201 |
| 2018/0047791 | A1* | 2/2018 | Tsai | H10K 59/1213 |
| 2018/0047798 | A1* | 2/2018 | Abe | H10K 59/122 |
| 2018/0061896 | A1* | 3/2018 | Cheng | H10K 50/852 |
| 2018/0182984 | A1* | 6/2018 | Lim | H10K 71/00 |
| 2018/0286929 | A1* | 10/2018 | Li | H10K 59/351 |
| 2018/0321536 | A1* | 11/2018 | Hu | G02F 1/133514 |
| 2019/0006429 | A1* | 1/2019 | Ota | H10K 50/865 |
| 2019/0173047 | A1* | 6/2019 | Sun | H10K 50/824 |
| 2019/0181189 | A1* | 6/2019 | Chang | H10K 59/351 |
| 2019/0355763 | A1* | 11/2019 | Chen | H01L 27/1251 |
| 2019/0379005 | A1* | 12/2019 | Im | H10K 50/814 |
| 2020/0176521 | A1* | 6/2020 | Cho | H10K 50/814 |
| 2022/0384529 | A1* | 12/2022 | Qi | H10K 59/121 |

FOREIGN PATENT DOCUMENTS

| | | | | |
|---|---|---|---|---|
| CN | 102047759 A | | 5/2011 | |
| CN | 102903729 A | | 1/2013 | |
| CN | 104282718 A | | 1/2015 | |
| CN | 104518001 A | * | 4/2015 | H01L 27/3213 |
| CN | 205645818 U | | 10/2016 | |
| TW | 202143476 A | * | 11/2021 | H01L 27/323 |

* cited by examiner

|  |  | Display substrate 3 | | | Display substrate 1 | | | |
|---|---|---|---|---|---|---|---|---|
|  |  | R | G | B | R | G (Coverage rate 50%) | B | (Portion not covered by CF) |
| Color coordinates | x | 0.669 | 0.222 | 0.14 | 0.663 | 0.260 | 0.141 | 0.294 |
|  | y | 0.331 | 0.716 | 0.1 | 0.337 | 0.685 | 0.053 | 0.656 |
| Substrate brightness (Cd/m²) |  | 150 | | | 150 | 150 | 150 | 88.5 |
| RGB brightness ratio |  | 26.2% | 65.0% | 8.7% | 22.9% | 68.4% | 8.7% | 68.4% |
| RGB sub-pixel brightness (Cd/m²) |  | 118 | 293 | 39 | 103 | 306 | 39 | 182 |
| IZO transmittance |  | 87.00% | 79.00% | 80.00% | 87.00% | 79.00% | 80.00% | 79.00% |
| Color filter transmittance |  | 82.20% | 69.40% | 39.60% | 82.20% | 69.40% | 39.60% |  |
| Pixel brightness (Cd/m²) |  | 165 | 534 | 124 | 144 | 460 | 124 | 230 |
| Current efficiency (Cd/A) |  | 18.12 | 62.7 | 3.43 | 18.12 | 62.7 | 3.43 |  |
| Gross power (W) |  | 264 | | | 252 | | | |
| LTC life time (h) |  | 925 | 390 | 650 | 925 | 390 | 650 |  |
| Sub-pixel life time (h) |  | 49774 | 2926 | 3859 | 62041 | 3713 | 3852 |  |
| Substrate life time (h) |  | 2926 | | | 3713 | | | |

| | x | y | z |
|---|---|---|---|
| Display substrate 3 | 0.222 | 0.716 | 0.062 |
| Display substrate 2 | 0.294 | 0.656 | 0.05 |
| Display substrate 1 | 0.260 | 0.685 | 0.056 |

DISPLAY SUBSTRATE AND MANUFACTURING METHOD THEREOF, DISPLAY PANEL AND DISPLAY DEVICE

This application is a continuation of U.S. patent application Ser. No. 16/335,972, filed Mar. 22, 2019, which is a U.S. National Phase Entry of International Application No. PCT/CN2018/092399 filed on Jun. 22, 2018, designating the United States of America and claiming priority to Chinese Patent Application No. 201710494463.1 filed on Jun. 26, 2017. The present application claims priority to and the benefit of the above-identified applications and the above-identified applications are incorporated by reference herein in their entirety.

TECHNICAL FIELD

Embodiments of the present disclosure relate to a display substrate and a fabrication method thereof, a display panel and a display device.

BACKGROUND

Organic Light-Emitting Diode (OLED) is an organic thin-film electroluminescent element, which has a broad application prospect because of advantages such as simple preparation process, fast response, high brightness, wide viewing angle, active luminescence, and easy implementation of flexible display.

An inkjet printing (IJP) technology, because of advantages such as low costs, low power consumption, and easy implementation of large-sized OLED display, becomes a key technology in a future large-sized OLED display field, and may also be an inevitable result of a trend from vacuum evaporation to solution process.

SUMMARY

At least one embodiment of the disclosure provides a display substrate. The display substrate comprises a plurality of pixels. Each of the plurality of pixels includes a plurality of sub-pixels that emit light of different colors, each of the sub-pixels includes a light emitting element, and at least one of the sub-pixels further includes a color filter. The color filter of the at least one of the sub-pixels covers a portion of a light emitting region of the light emitting element of the at least one of the sub-pixels, and a color of the color filter of the at least one of the sub-pixels is the same as a color of light emitted by the light emitting element of the at least one of the sub-pixels.

In the display substrate provided by at least one embodiment of the disclosure, in at least two of the sub-pixels, the color filters respectively cover portions of the light emitting regions of the light emitting elements of the at least two of the sub-pixels, and coverage rates of the color filters covering the light emitting regions of the light emitting elements of the at least two of the sub-pixels are different from each other.

In the display substrate provided by at least one embodiment of the disclosure, each of the sub-pixels includes the color filter, the color filter covers a portion of the light emitting region of the light emitting element, and the color of the color filter is the same as the color of light emitted by the light emitting element.

In the display substrate provided by at least one embodiment of the disclosure, among the plurality of pixels, coverage rates of the color filters covering the light emitting regions of the light emitting elements of the sub-pixels are the same in the sub-pixels including the color filters of the same color.

In the display substrate provided by at least one embodiment of the disclosure, each of the plurality of pixels includes three of the sub-pixels, the three of the sub-pixels are respectively a red-light sub-pixel, a green-light sub-pixel and a blue-light sub-pixel that respectively emit red light, green light and blue light, and the at least one of the sub-pixels is the red-light sub-pixel, the green-light sub-pixel or the blue-light sub-pixel.

In the display substrate provided by at least one embodiment of the disclosure, in the at least one of the sub-pixels, a coverage rate of the color filter is greater than 0 and less than or equal to 50%.

In the display substrate provided by at least one embodiment of the disclosure, coverage rates of the color filters of the sub-pixels are in an order of: a coverage rate of the color filter of the green sub-pixel<a coverage rate of the color filter of the blue sub-pixel<a coverage rate of the color filter of the red sub-pixel.

In the display substrate provided by at least one embodiment of the disclosure, in the at least one of the sub-pixels, a position where the color filter is provided corresponds to a center portion of the light emitting region of the light emitting element.

The display substrate provided by at least one embodiment of the disclosure further comprises: a black matrix, provided at a peripheral edge of the color filter.

The display substrate provided by at least one embodiment of the disclosure further comprises: a circuit layer, electrically connected with the light emitting element so as to drive the light emitting element to emit light.

At least one embodiment of the disclosure provides a display panel. The display panel comprises the display substrate as described above.

At least one embodiment of the disclosure provides a display device. The display device comprises the display panel as described above.

At least one embodiment of the disclosure provides a fabrication method of a display substrate, comprising: forming a plurality of pixels. Each of the plurality of pixels includes a plurality of sub-pixels that emit light of different colors, each of the sub-pixels includes a light emitting element, and at least one of the sub-pixels is covered by a color filter. The color filter of the at least one of the sub-pixels covers a portion of a light emitting region of the light emitting element of the at least one of the sub-pixels, and a color of the color filter of the at least one of the sub-pixels is the same as a color of light emitted by the light emitting element of the at least one of the sub-pixels.

In the fabrication method of the display substrate provided by at least one embodiment of the disclosure, a light emitting layer of the light emitting element is formed by inkjet printing.

In the fabrication method of the display substrate provided by at least one embodiment of the disclosure, in at least two of the sub-pixels, the color filters respectively cover portions of the light emitting regions of the light emitting elements of the at least two of the sub-pixels, and coverage rates of the color filters covering the light emitting regions of the light emitting elements of the at least two of the sub-pixels are different from each other.

In the fabrication method of the display substrate provided by at least one embodiment of the disclosure, each of the sub-pixels is covered by the color filter, the color filter covers a portion of the light emitting region of the light emitting element, and the color of the color filter is the same as the color of light emitted by the light emitting element.

In the fabrication method of the display substrate provided by at least one embodiment of the disclosure, a coverage rate of the color filter of the at least one of the sub-pixels is selected according to a color gamut or a lifetime.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Similarly, expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

Inventors of the present disclosure finds that: since inkjet printing technology is not yet mature, a lifetime of an inkjet-printed element is not satisfied, for example, in a case where a color light emitting element is inkjet-printed, a chromatic dot thereof cannot meet a requirement of a display substrate. Different from an evaporation technology used in a white OLED, the inkjet printing technology can be used for implementing monochromatic light emission of a sub-pixel; so the inkjet-printed color light emitting element can emit light of a color such as red, green or blue, without adding a color filter (CF). Adding the color filter will result in a better final gamut of the display substrate, but will shorten a lifetime of the display substrate.

Figures 1A, 1B:
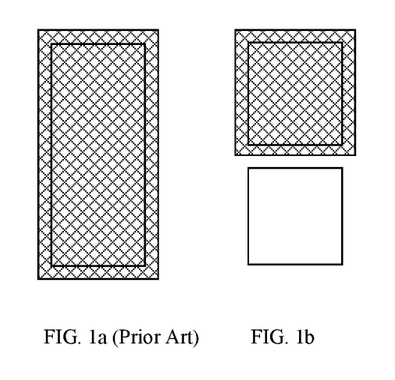
FIG. 1a is a schematic diagram of a color filter completely covering a pixel opening region.
FIG. 1b is a schematic diagram of a color filter covering a portion of a light emitting region of a light emitting element in a display substrate provided by embodiments of the present disclosure.

A conventional color filter is designed in such a way that the color filter completely covers a light emitting region of the sub-pixel of the display substrate, for example, a pixel opening region, as shown in FIG. 1a, so that the monochromatic light finally emitted from the sub-pixel is completely light transmitted through the color filter. Since the color filter will cause loss of a portion of light transmitted through it, that is, the color filter has certain transmittance, it is necessary to increase a working current of an OLED in the sub-pixel to increase brightness of the sub-pixel so as to satisfy brightness required for display. In general, a blue CF has the lowest transmittance, a red CF has the highest transmittance, and a green CF falls in between. The lifetime of the display substrate is mainly determined by a lifetime of the inkjet-printed light emitting element itself and an actual maximum working current density of the display substrate; under same brightness and same luminous efficiency, the lower the transmittance of the sub-pixel, the higher the maximum working current density required for the OLED. For example, for the display substrate having sub-pixels of three colors of red, green and blue, its lifetime is equal to a shortest lifetime among lifetimes of the sub-pixels of the three colors of red, green and blue. For example, in some display substrate, the transmittance of the green CF is not the lowest, but the lifetime of a green light emitting element itself is the shortest, so in the display substrate, the lifetime of the inkjet-printed green light emitting element is not satisfied, which affects the lifetime of the whole display substrate.

The lifetime of the display substrate is mainly determined by the lifetime of the inkjet-printed light emitting element itself and the actual maximum working current density of the display substrate, and a lifetime calculation formula of a pixel where the inkjet-printed light emitting element is located is:

$$LT95_{LTC} * \left(\frac{J_{LTC}}{J_{pixel}}\right)^{1.6} = LT95_{pixel}$$

Where, LT95 refers to time (i.e., the lifetime) for brightness of the light emitting element to decay to 95% of original brightness, $LT95_{LTC}$ is the LT95 lifetime of a tested target light emitting element, $J_{LTC}$ is a current density of the tested target light emitting element during a test, $J_{pixel}$ refers to a current density of the pixel of the display substrate at maximum brightness, and $LT95_{pixel}$ refers to the LT95 lifetime of the pixel of the target light emitting element when corresponding to the $J_{pixel}$.

The lifetime of the display substrate is equal to the shortest lifetime among lifetimes of the sub-pixels that emit light of different colors, and thus, under same brightness and same luminous efficiency, the lower the transmittance of the color filter, the higher the maximum working current density required for the display substrate in order to achieve the same brightness, which may shorten the lifetime of the display substrate. Generally, the blue color filter has the lowest transmittance, the red color filter has the highest transmittance, and the green color filter falls in between; while with respect to the lifetime of the light emitting element itself, lifetimes of light emitting elements of respective colors may be different from one another.

In a conventional display substrate, the color filter is provided such that the color filter completely covers the light emitting region of the sub-pixel of the display substrate, for example, the pixel opening region, as shown in FIG. 1a, so the monochromatic light finally emitted from the sub-pixel is completely transmitted through the color filter and then emitted out. Thus, in the case of providing the color filter, it is necessary to increase the current of the sub-pixel, so as to satisfy brightness required for the sub-pixel; however, increasing the current of the light-emitting element of the sub-pixel tends to shorten the lifetime of the sub-pixel, which may further shorten the lifetime of the whole display substrate.

At least one embodiment of the present disclosure provides a display substrate, the display substrate comprises a plurality of pixels, each pixel includes a plurality of sub-pixels that emit light of different colors, each sub-pixel includes a light emitting element, at least one sub-pixel further includes a color filter, the color filter of the at least one sub-pixel covers a portion of a light emitting region of the light emitting element (as shown in FIG. 1b, in which a shadow region is a region covered by the color filter) of the at least one sub-pixel, and a color of the color filter of the at least one sub-pixel is the same as a color of light emitted by the light emitting element of the at least one sub-pixel.

At least one embodiment of the present disclosure provides a fabrication method of a display substrate, the method comprises forming a plurality of pixels; each pixel includes a plurality of sub-pixels that emit light of different colors, each sub-pixel includes a light emitting element, at least one sub-pixel further includes a color filter, the color filter of the at least one sub-pixel covers a portion of a light emitting region of the light emitting element of the at least one sub-pixel, and a color of the color filter of the at least one sub-pixel is the same as a color of light emitted by the light emitting element of the at least one sub-pixel.

Hereinafter, a concept of the present disclosure will be explained through several specific embodiments.

At least one embodiment of the present disclosure provides the display substrate, the display substrate comprises the plurality of pixels; for example, each pixel includes three sub-pixels respectively emitting light of three colors of red, blue and green, each sub-pixel includes the light emitting element, at least one of the three sub-pixels further includes the color filter, the color filter covers a portion of the light emitting region of the light emitting element of the at least one of the three sub-pixels, and the color of the color filter is the same as the color of light emitted by the light emitting element of the at least one of the three sub-pixels.

It should be noted that, in the expression that "the color of the color filter is the same as the color of light emitted by the light emitting element", "the same" refers to that "the color" before "the same" and "the color" after "the same" match with each other, for example, both are green, red or blue, instead of requiring that a wavelength of light transmitted through the color filter is completely the same as a wavelength of light emitted from the light emitting element. For example, selection of color filters of respective colors may be determined according to a desired color gamut by using a conventional method.

Figure 2:
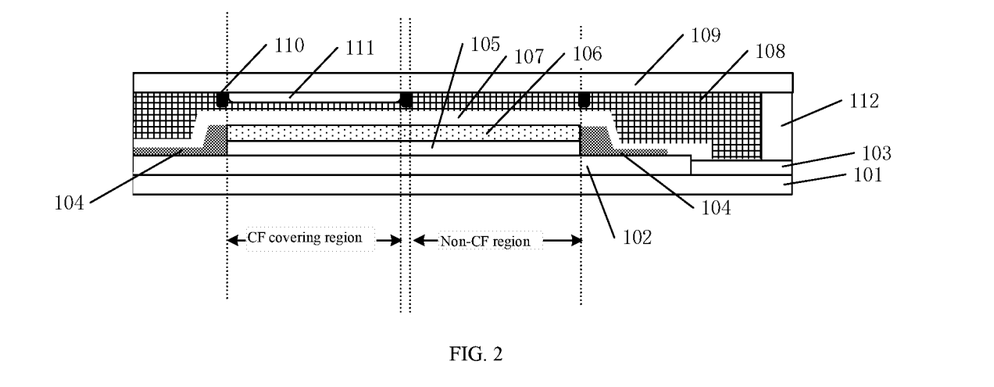
FIG. 2 is a schematic diagram of the display substrate of a top-emitting type provided by the embodiments of the present disclosure.

For example, FIG. 2 is a schematic diagram of the color filter of the sub-pixel covering the light emitting region of the light emitting element in the display substrate provided by the embodiments of the present disclosure. In this embodiment, the display substrate is a display substrate of top-emitting type. The display substrate comprises a base substrate 101; a circuit layer 102 including a switching thin film transistor (TFT), a driving TFT, a storage capacitor, and the like is provided on the base substrate 101; and the circuit layer 102 is electrically connected with the light emitting element so as to drive the light emitting element to emit light. A conventional design may be used in a specific configuration of the circuit layer 102, for example, a 2T1C (i.e., a combination of two TFTs and one storage capacitor) pixel circuit or other pixel circuit with a compensation function may be used, which will not be limited in the embodiments of the present disclosure.

For example, the base substrate 101 is further provided thereon with a peripheral metal (a lead) 103 for connecting the display substrate and an external signal source; the circuit layer 102 is provided thereon with a pixel defining layer 104 defining the light emitting region of the sub-pixel; an anode 105 and a light emitting layer 106 are sequentially formed from bottom to top within a space surrounding by the pixel defining layer, and a cathode 107 is formed on the light emitting layer 106. The anode 105, the light emitting layer 106 and the cathode 107 constitute the light emitting element of the sub-pixel, and a region where the light emitting layer 106 is located is just the light emitting region of the light emitting element. The cathode 107 is, for example, a common cathode. The light emitting layer 106 for example is a single layer or a composite layer, and the composite layer is, for example, a laminate structure comprising a hole injection layer, a hole transport layer, an organic light emitting layer, an electron transport layer and an electron injection layer. In addition, in the example shown in the diagram, a reflective layer (not shown) is further provided below the anode 105 to reflect light emitted from the light emitting layer 106 upward, and thus, the light emitting element of the top-emitting type is obtained; and the reflective layer is, for example, a metal layer, such as a metal aluminum.

For example, the display substrate further comprises an insulating layer 108 provided on the cathode 107. In addition, a region where the insulating layer 108 is located for example further includes a cover layer, a passivation layer, a lateral sealing layer, and other structures, to ensure planarization of the display substrate and independent work of respective regions of the display substrate; and for the sake of brevity, the above-described structures are not shown in the diagram.

For example, the display substrate further comprises a cover plate 109, a black matrix 110, and a color filter 111 covering a portion of the light emitting layer 106. The black matrix 110 is used for preventing color mixture between different sub-pixels. For example, the black matrix 110 is provided at a peripheral edge of the color filter, for example, the black matrix 110 is provided between a region where the CF is provided and a region where the CF is not provided, so as to define a CF covering region and a non-CF region in the light emitting region of the light emitting element. The color filter 111 is provided in the CF covering region. The color filter may be made of a color resin material, a color photoresist material, and the like, for example, a conventional material, and specific selection thereof will not be repeated here.

Figure 3A:
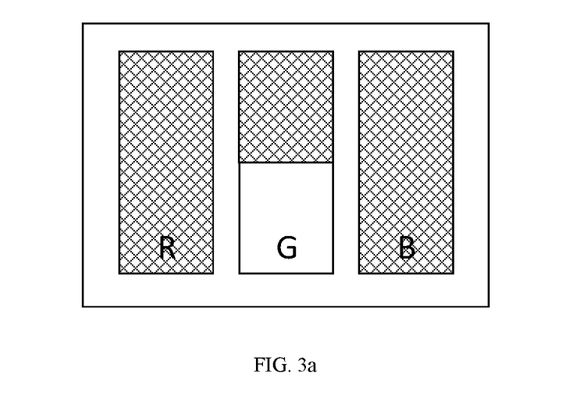
FIG. 3a to FIG. 3c are schematic diagrams of the color filter covering a portion of the light emitting region of the light emitting element in the display substrate provided by the embodiments of the present disclosure.

For example, the light emitting layer 106 of the sub-pixel is a light emitting layer that emits red light, green light or blue light; for example, in one example, the light emitting layer 106 emits green light, so the color of the color filter 111 of the sub-pixel is green; for example, a coverage rate of the color filter 111 covering the light emitting region of the light emitting element in this example is 50%. A schematic diagram of a covering mode of the color filter 111 is shown in FIG. 3a: the light emitting layer 106 is equally divided into two halves along a length direction thereof, and one half is covered by the green color filter 111. It should be noted that a shadow portion in the diagram is only schematically represented as a position where the color filter covers the light emitting region of the sub-pixel, and there may be a space or other structures, for example, the black matrix and the like, between a portion of the sub-pixel covered by the color filter and a portion of the sub-pixel not covered by the color filter.

Figure 5:
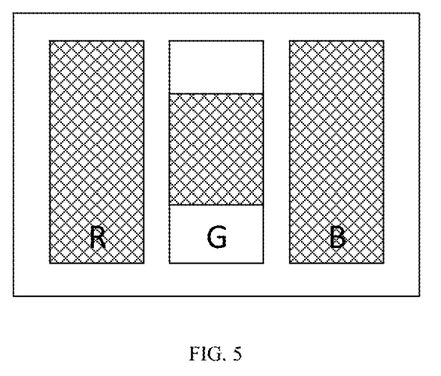
FIG. 5 is another schematic diagram of the color filter covering a portion of the light emitting region of the light emitting element in the display substrate provided by the embodiments of the present disclosure.

Of course, in other embodiments, a covering mode of the color filter 111 may be adjusted; for example, the color filter 111 covers a center portion of the light emitting region, as shown in FIG. 5, with a center of the color filter 111 overlapping with a center of the light emitting region. A specific coverage position of the color filter 111 covering the light emitting region will not be limited in the embodiments of the present disclosure.

For example, in the sub-pixels of the display substrate that respectively emit blue light and red light, coverage rates of a blue color filter and a red color filter may be adjusted. For example, in one example, the green light emitting element has a relatively short lifetime and becomes a main element for controlling the lifetime of the display substrate, while life times of the elements of the other two colors are not much different, and therefore, the coverage rates of the blue color filter and the red color filter for example are both 100%, so as to ensure a color gamut required by the display substrate while improving the overall lifetime of the display substrate.

Figure 3B:
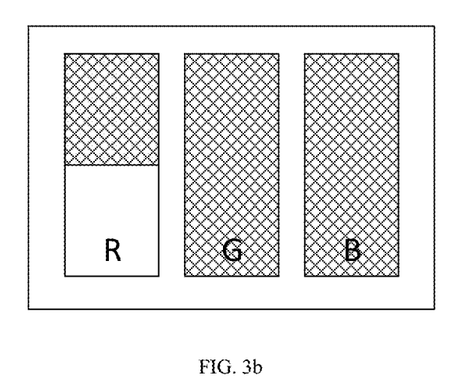
Figure 3C:
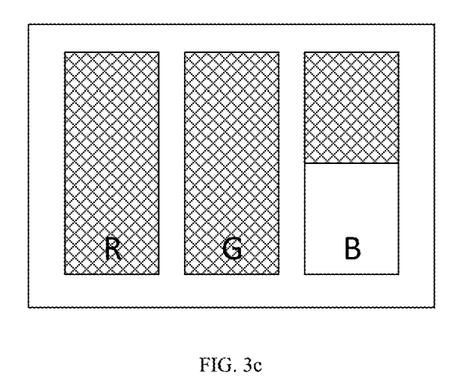

For example, in other examples, the coverage rates of the color filters of respective colors may be selected according to actual situations, for example, the lifetime of the light emitting element itself, the optical transmittance of the color filter, and the like. For example, in a case where the lifetime of the red light emitting element of the display substrate is relatively short, the coverage rate of the red color filter is reduced, as shown in FIG. 3b (the diagram shows a case where the coverage rate of the color filter is 50%, and in other embodiments, any suitable coverage rate within 0 to 100% may be selected according to actual needs). For example, in a case where the lifetime of the blue light emitting element of the display substrate is relatively short, the coverage rate of the blue color filter is reduced, as shown in FIG. 3c (likewise, the diagram shows a case where the coverage rate of the color filter is 50%, and in other embodiments, any suitable coverage rate within 0 to 100% may be selected according to actual needs).

Figure 4:
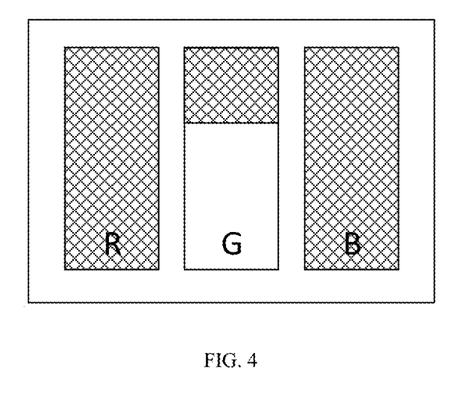
FIG. 4 is a schematic diagram of a green color filter covering a portion of the light emitting region of the light emitting element in the display substrate provided by the embodiments of the present disclosure.

For another example, in the display substrate provided by the embodiments of the present disclosure, the lifetime of the green light emitting element is the shortest, so the lifetime of the display substrate is determined by the green light emitting element having the shortest lifetime. In order to prolong the lifetime of the display substrate, in one example, as shown in FIG. 4, a small portion of the light emitting region of the sub-pixel emitting green light is selected to be covered by the color filter, for example, the coverage rate of the color filter is 30%, so as to reduce a current required for actual working of the sub-pixel where the green light emitting element is located while improving the lifetime of the display substrate to a certain extent. At this time, the life times of the light emitting elements of the other two colors are not much different; in order to ensure the color gamut of the display substrate, the color filters of the other two colors completely cover the light emitting regions of the sub-pixels of the other two colors, respectively. For another example, in the display substrate provided by the embodiments of the present disclosure, the life times of the sub-pixels emitting light of the three colors of red, green and blue are respectively calculated by using the lifetime calculation formula as described above in conjunction with factors such as the lifetime of the light emitting element itself and the optical transmittance of the color filter, and the coverage rates of respective color filters covering the light emitting regions of the corresponding sub-pixels are selected according to lifetime comparison of the sub-pixels of the three colors.

Figure 6A:
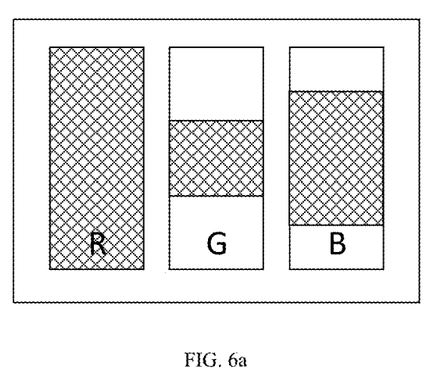
FIG. 6a is still another schematic diagram of the color filter covering a portion of the light emitting region of the light emitting element in the display substrate provided by the embodiments of the present disclosure.

For example, as shown in FIG. 6a, in one example, the green sub-pixel of the display substrate has the shortest lifetime, the red sub-pixel has the longest lifetime, and the blue sub-pixel falls in between, so in the display substrate, the coverage rates of the color filters covering the light emitting regions of the sub-pixels are selected in an order of: the coverage rate of the green sub-pixel<the coverage rate of the blue sub-pixel<the coverage rate of the red sub-pixel, for example, the coverage rate of the green sub-pixel, the coverage rate of the blue sub-pixel and the coverage rate of the red sub-pixel are respectively 40%, 60% and 100%, which, thus, simultaneously improves the life times of the green sub-pixel and the blue sub-pixel to different extents, reduces a lifetime difference between the light emitting elements of the respective colors, and prolongs the lifetime of the display substrate as a whole.

Figure 6B:
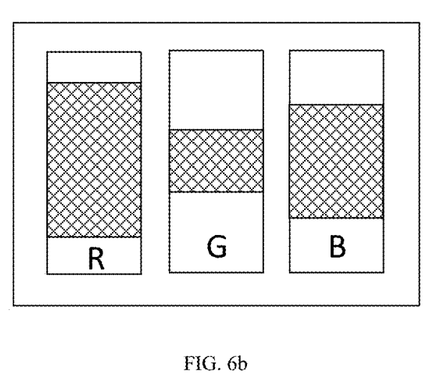
FIG. 6b is still another schematic diagram of the color filter covering a portion of the light emitting region of the light emitting element in the display substrate provided by the embodiments of the present disclosure.

For example, in the display substrate provided by the embodiments of the present disclosure, among the plurality of pixels of the display substrate, coverage rates of the color filters of the sub-pixels including color filters of the same color are the same. For example, as shown in FIG. 6b, one pixel of the display substrate has three sub-pixels respectively emitting red light, green light and blue light, and the coverage rates of the color filters of the three colors are respectively 70%, 30% and 50%, then in other pixels, the coverage rates of the color filters of the sub-pixels of the same color are the same, that is, the coverage rates of the color filters of the three colors of red, green and blue are also respectively 70%, 30% and 50%. In addition, among the plurality of pixels of the display substrate, arrangement orders of the sub-pixels that emit light of respective colors for example are the same; among the sub-pixels, coverage positions of the color filters of the same color are the same, for example, the sub-pixels of the respective colors are arranged in an order of the red sub-pixel, the green sub-pixel and the blue sub-pixel, or in other suitable mode, and the coverage positions of color filters of the same color are all in center portions of light emitting regions of the sub-pixels, and so on, which will not be repeated here.

In one embodiment of the present disclosure, the solution for covering a portion of the light emitting region of the light emitting element by the color filter to improve the lifetime of the display substrate is applied to the display substrate of a bottom emitting type.

Figure 7:
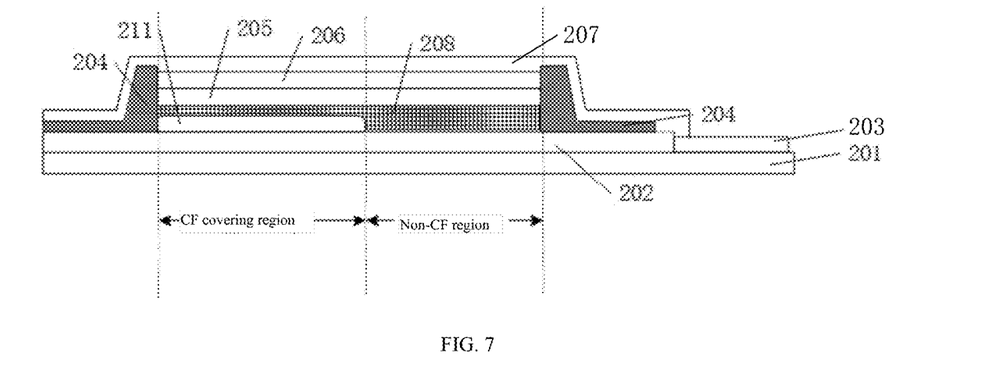
FIG. 7 is a schematic diagram of the display substrate of a bottom-emitting type provided by the embodiments of the present disclosure.

For example, as shown in FIG. 7, the display substrate comprises the base substrate 201; the base substrate 201 is provided thereon with the circuit layer 202 including the switching thin film transistor (TFT), the driving TFT, the storage capacitor, and the like; the base substrate 201 is further provided thereon with the peripheral metal 203 for connecting the display substrate to the external signal source; the circuit layer 202 is provided thereon with the pixel defining layer 204 for defining the light emitting region of the sub-pixel; unlike the display substrate of the top emitting type, in this embodiment, the color filter 211 is firstly formed within the space surrounding by the pixel defining layer 204 and located on the circuit layer 202, then the insulating layer 208, the anode 205, the light emitting layer 206 and the cathode 207 are formed on the color filter 211; the anode 205, the light emitting layer 206 and the cathode 207 constitute the light-emitting element, and the cathode 207 for example is the common cathode. Of course, the display substrate provided by the embodiments for example further comprises the reflective layer, the black matrix, the cover plate, and other structures, and these structures are arranged in a conventional mode, which, thus, are not shown in the diagram. The reflective layer reflects light emitted from the light emitting layer 206 downward, and then the reflected light is transmitted through the light emitting region and emitted out; and the reflective layer, for example, is a metal layer, such as a metal aluminum.

At least one embodiment of the present disclosure provides the fabrication method of the display substrate, and the fabrication method comprises: forming the plurality of pixels; each of the plurality of pixels includes three sub-pixels respectively emitting light of three colors of red, blue and green, each sub-pixel includes the light emitting element, at least one of the sub-pixels is further covered by the color filter, the color filter of the at least one sub-pixel covers a portion of the light emitting region of the light emitting element of the at least one sub-pixel, and the color of the color filter is the same as the color of light emitted from the light emitting element of the at least one sub-pixel.

With the display substrate of the top emitting type as an example, FIG. 8a to FIG. 8f are schematic flow charts of exemplary fabrication method of the display substrate of the top emitting type provided by the embodiments of the present disclosure.

Figure 8A:
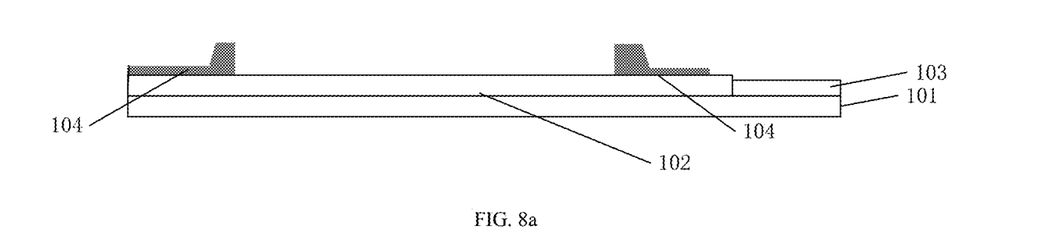
FIG. 8a to FIG. 8f are schematic flow charts of manufacturing the display substrate of the top-emitting type provided by the embodiments of the present disclosure.

As shown in FIG. 8a, firstly, the circuit layer 102 provided with the switching thin film transistor (TFT), the driving TFT and the storage capacitor, etc., as well as the peripheral metal 103 are formed on the base substrate 101; the base substrate 101 may be made of quartz, glass, plastic, or other suitable material, the thin film transistor (TFT) in the circuit layer 102 includes a gate electrode, a source electrode and a drain electrode, etc.; the peripheral metal 103 may be made of a conductive metal such as copper and aluminum, so that the display substrate is electrically connected with the external signal source. Then, the pixel defining layer 104 is formed on the circuit layer 102, and is used for defining the light emitting region of the sub-pixel. The pixel defining layer may be made of an inorganic insulating material or an organic insulating material, for example, an organic resin. For example, on the circuit layer 102, the reflective layer is formed at least in the light emitting region, and the reflective layer may be, for example, a metal layer, such as a metal aluminum.

Figure 8B:
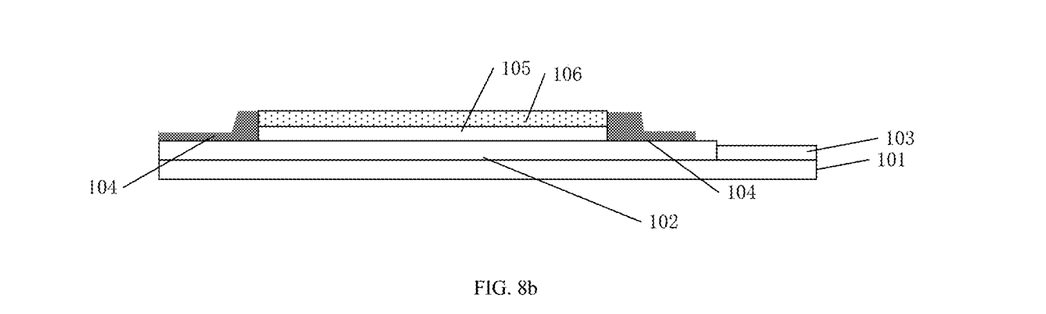

As shown in FIG. 8b, after the pixel defining layer 104 is formed, the anode 105 is formed within the space surrounding by the pixel defining layer 104; the anode 105 may be made of indium zinc oxide (IZO) or indium tin oxide (ITO), etc., indium tin oxide (ITO) has characteristics of stable property, excellent electrical conductivity, light transmission, etc., and is commonly used as a material of the anode; and then, the light emitting layer 106 is formed on the anode 105, and the light emitting layer 106 may be made of an organic light-emitting material that emits red light, green light or blue light. The light emitting layer 106 may be the single layer or the composite layer, and the composite layer may be, for example, the laminate structure comprising the hole injection layer, the hole transport layer, the organic light emitting layer, the electron transport layer and the electron injection layer. For example, the light emitting layer may be formed by using a method of inkjet printing.

Figure 8C:
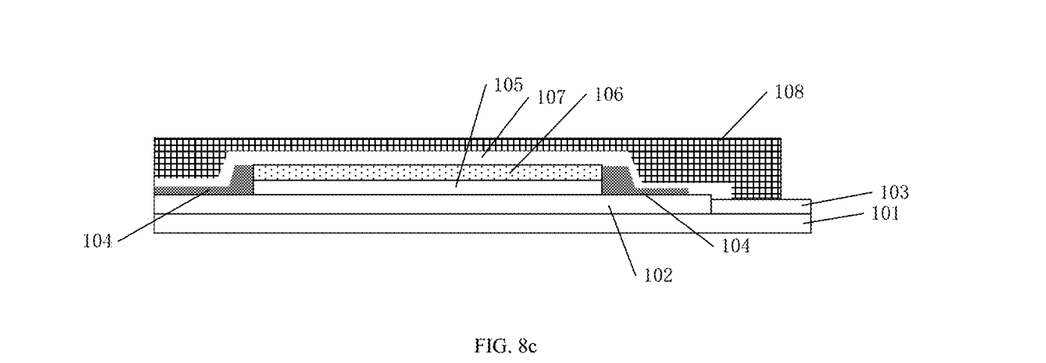

As shown in FIG. 8c, the cathode 107 is formed on the light emitting layer 106, and the cathode 107 may be made of a metal such as silver, aluminum or magnesium or an alloy material; the cathode 107 covers the light emitting layer 106 and the pixel defining layer 104, and is connected with the peripheral metal 103; and therefore, in a case where a driving signal is input, a hole injected from the anode 105 captures an electron injected from the cathode 107 in the light emitting layer 106 to generate an exciton, so as to emit light, and the emitted light is transmitted through the light emitting region defined by the pixel defining layer 104 and emitted out.

Afterwards, the insulating layer 108 is formed on the cathode 107, to ensure planarization of the display substrate and electrically isolate respective regions of the display substrate; and the insulating layer 108 may be made of a material such as silicon oxide, silicon nitride and silicon oxynitride. It should be noted that, structures such as the cover layer, the passivation layer and the lateral sealing layer may be further included in the region where the insulating layer 108 is located, and the above-described structures may be all provided in a conventional mode, which will not be repeated here.

Figure 8D:
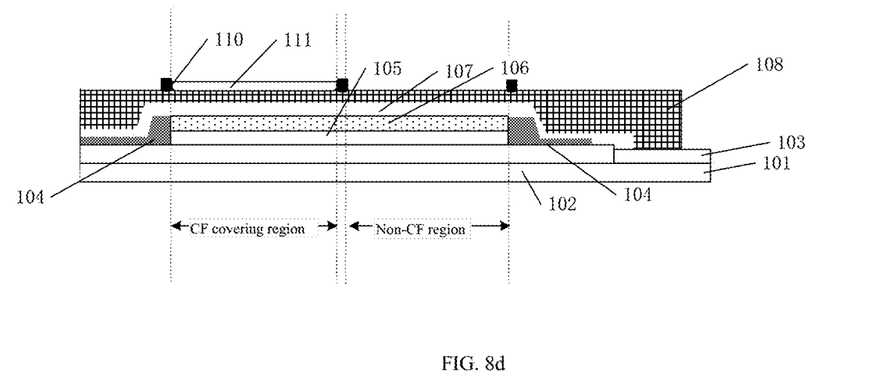

As shown in FIG. 8d, the black matrix 110 is formed on the insulating layer 108, to define respective sub-pixels, and further to define the CF covering region and the non-CF region of the light emitting region of the sub-pixel, and the color filter 111 is formed in the CF covering region; and the black matrix 110 may be made of a material such as a metal chromium or chromium oxide, or may be made of a material such as an acrylic resin doped with a black pigment (for example, carbon). In one example, the coverage rate of the color filter 111 covering the light emitting region is 50%.

Figure 8E:
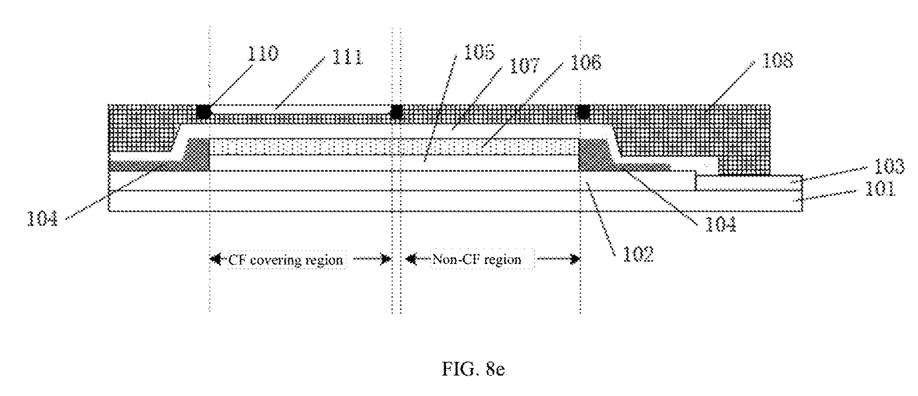

As shown in FIG. 8e, after the black matrix 110 and the color filter 111 are formed, the display substrate is planarized with a same material as the insulating layer 108 to form a flat upper surface.

Figure 8F:
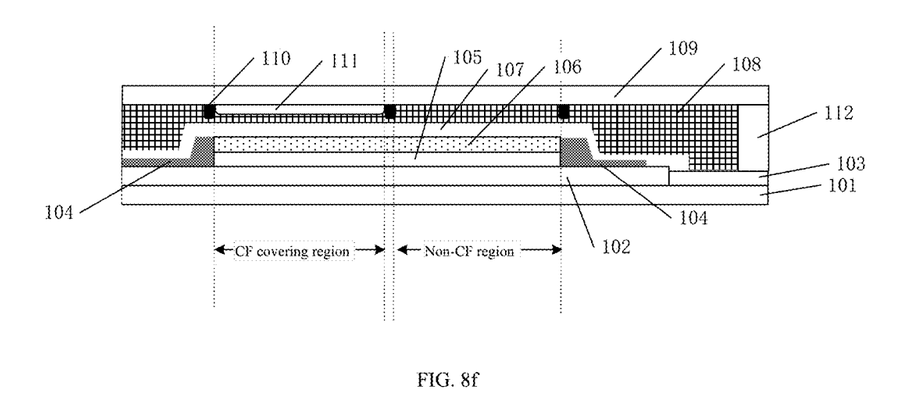

As shown in FIG. 8f, the flat upper surface is covered with the cover plate 109, the cover plate 109 may be a substrate made of glass, quartz or other suitable material; and finally, a package film 112 is formed at a lateral edge of the display substrate with a package material such as a sealant or a glass glue, to prevent moisture, oxygen, and the like from entering the inside of the display substrate.

In the above-described embodiments, the light emitting element of the sub-pixel where the color filter 111 is located for example emits green light, so the color of the color filter 111 is also green, and the coverage rate of the green color filter is 50%; in the other two sub-pixels of the plurality of pixels of the display substrate provided by the embodiments, the coverage rates of the red color filter and the blue color filter respectively located in the sub-pixels emitting red light and blue light are all 100%; in the plurality of pixels of the display substrate, the coverage rates of the color filters in the sub-pixels emitting light of the same color are the same, and meanwhile, the sub-pixels of the three colors are also arranged in the same order, which is, red (R), green (G) and blue (B).

Figure 9A:
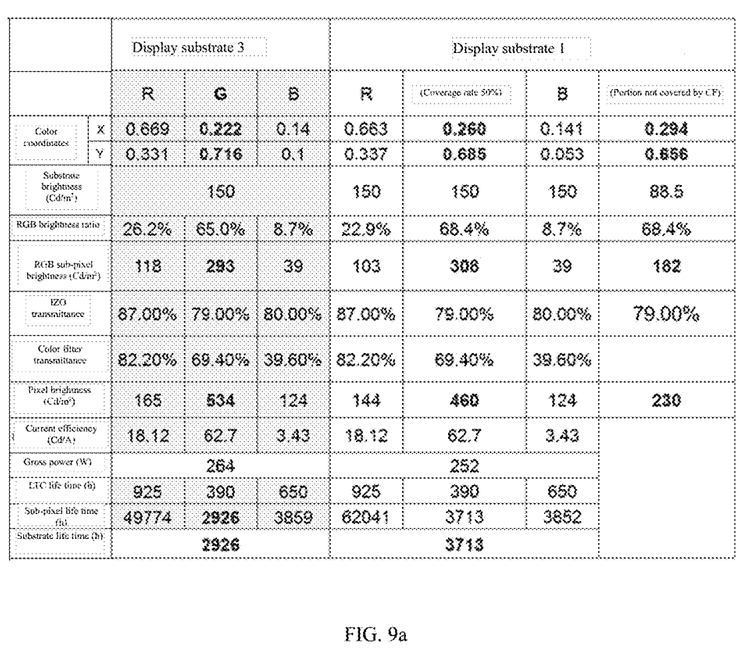
FIG. 9a to FIG. 9c are comparison diagrams of the display substrate provided by the embodiments of the present disclosure and comparative display substrates in terms of a light-emitting performance, a lifetime, and a color gamut.

After fabrication of the display substrate is completed, the display substrate is tested for respective performances such as a light-emitting performance and a lifetime. With other conditions the same as those according to the embodiments, a display substrate whose green color filter has a coverage rate of 0 (hereinafter referred to as a display substrate 2), and a display substrate whose sub-pixels emitting light of three colors are all completely covered by the color filters (hereinafter referred to as a display substrate 3) are compared in terms of respective performances, for example, the light-emitting performance and the lifetime, etc.; and a comparison result is shown in FIGS. 9a-9c.

As can be seen from FIG. 9a, the lifetime of the display substrate (whose green color filter has the coverage rate of 50%, hereinafter referred to as a display substrate 1) provided by the embodiments is 3713 hours, which is significantly longer than the lifetime of the display substrate whose sub-pixels are completely covered by the color filters, which is 2926 hours; and meanwhile, in a case where the two has same substrate brightness (both of 150 $Cd/m^2$), the other performances of the two, for example, pixel brightness and sub-pixel brightness, etc. are not much different, while pixel brightness of the display substrate 1 is slightly reduced, so that power consumption can be reduced.

Figure 9B:
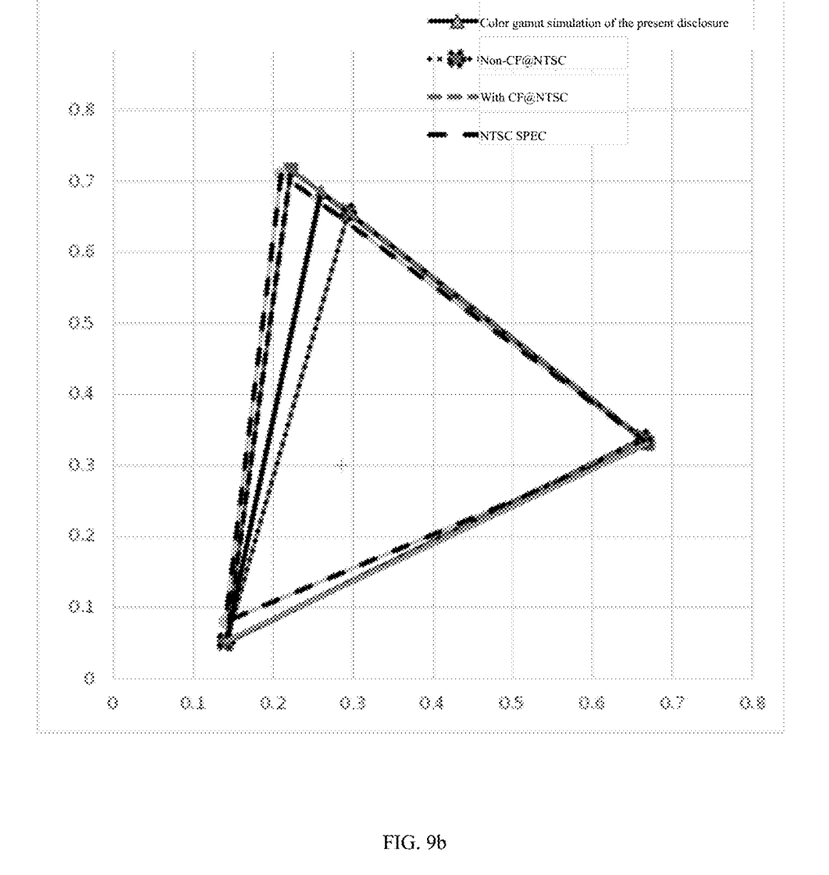
Figure 9C:
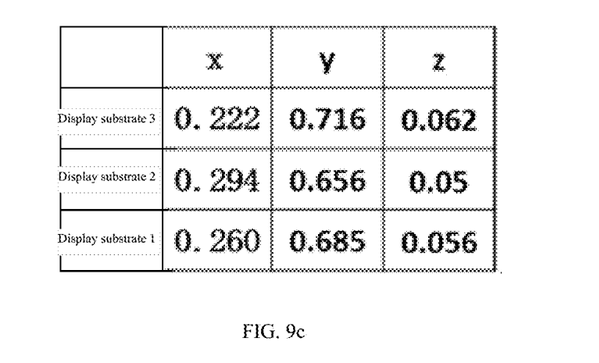

FIG. 9b and FIG. 9c are comparison charts of display substrates 1, 2 and 3 in terms of the color gamut and color coordinates; it can be seen from FIG. 9c that values of three color coordinates of the display substrate 1 are all located between those of the display substrate 2 and those of the display substrate 3; it can be seen from FIG. 9b that the color gamut of the display substrate 1 is better than that of the display substrate 2; in addition, although the color gamut of the display substrate 1 is smaller than that of the display substrate 3, the color gamut of the display substrate 1 is still maintained at a relatively high level, which meets display requirements of a product; and it is important that the display substrate 1 improves the lifetime of the product while ensuring the color gamut.

Figure 10:
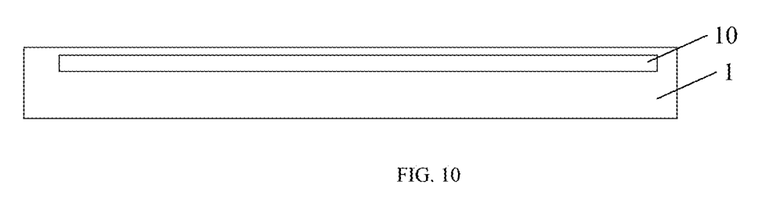
FIG. 10 is a schematic diagram of a display panel provided by the embodiments of the present disclosure.

The embodiments of the present disclosure further provides a display panel, and as shown in FIG. 10, the display panel 1 comprises the display substrate 10 according to any one of the above-described embodiments; the display panel 1 may be an organic electroluminescent display panel or an inorganic electroluminescent display panel, and the like, and a specific type of the display panel 1 will not be limited here. In the display panel, a portion of the light emitting region of the light emitting element is covered by the color filter, which improves the lifetime of the display panel while ensuring the color gamut of the display panel.

Figure 11:
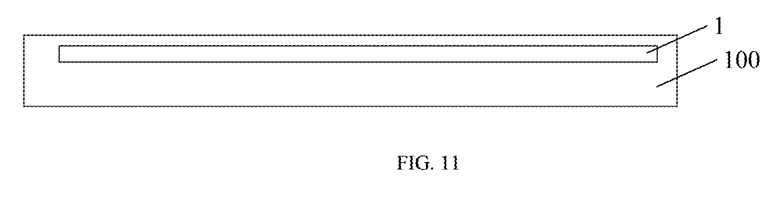
FIG. 11 is a schematic diagram of a display device provided by the embodiment of the present disclosures.

The embodiments of the present disclosure further provides a display device, and as shown in FIG. 11, the display device 100 comprises the above-described display panel 1; the display device 100 may be an organic electroluminescent display or an inorganic electroluminescent display, and the like, and a specific type of the display device 100 will not be limited here. In the display device, a portion of the light emitting region of the light emitting element is covered by the color filter, which improves the lifetime of the display device while ensuring the color gamut of the display device.

For example, the display device may be used, for example, in a monitor, a mobile phone, a navigator, a television, a desktop display, a head mounted display and any other device or apparatus having a display function.

At least one embodiment of the present disclosure provides the display substrate and the fabrication method thereof, the display panel and the display device, which may have at least one advantageous effect below:

(1) In the display substrate provided by the embodiments of the present disclosure, a portion of the light emitting region of the sub-pixel is covered by the color filter, which achieves a technical effect of improving the lifetime of the display substrate while ensuring the color gamut of the display substrate.

(2) In the fabrication method of the display substrate provided by the embodiments of the present disclosure, the coverage rates of the color filters of different colors covering the light emitting regions of the sub-pixels are selected according to situations of, for example, the lifetime of the light emitting element itself, the optical transmittance of the color filter, and the like, so that the life times of the sub-pixels of different colors are improved in a targeted manner, which reduces a difference in lifetime among sub-pixels of different colors, and achieves a technical effect of improving the lifetime of the display substrate as a whole.

There are some points to be illustrated:

(1) Drawings of the embodiments of the present disclosure only refer to structures related with the embodiments of the present disclosure, and other structures may refer to general design.

(2) For the sake of clarity, in the drawings used for describing the embodiments of the present disclosure, thicknesses of layers or regions are enlarged or reduced, that is, these drawings are not drawn to actual scales.

(3) In case of no conflict, the embodiments of the present disclosure and the features in the embodiments may be combined with each other to obtain a new embodiment.

The above merely is specific embodiments of the present disclosure, and not intended to define the scope of the present disclosure. Any variations or replacements which can be easily thought of by those skilled in the art in the scope of the present disclosure all shall fall within the scope of protection of the present disclosure. Therefore, the scope of the present disclosure should be the scope of the following claims.

The invention claimed is:

1. A display substrate, comprising a plurality of pixels, wherein each of the plurality of pixels comprises a plurality of sub-pixels that emit light of different colors, and each of the plurality of sub-pixels comprises a light emitting element, the light emitting element comprises an upper electrode, a lower electrode, and a light emitting layer provided between the upper electrode and the lower electrode;

each of at least two of the plurality of sub-pixels comprises a color filter, the color filter has a solid structure; without any opening, and the color filter covers at least a portion of a light emitting region of the light emitting element of the sub-pixel which comprises the color filter;

a color of light emitted by the light emitting element of at least one of the at least two of the plurality of sub-pixels includes a color of the color filter of the at least one of the at least two of the plurality of sub-pixels;

the plurality of sub-pixels that emit light of different colors comprise a red-light sub-pixel, a green-light sub-pixel, and a blue-light sub-pixel that respectively emit red light, green light, and blue light;

the at least two of the plurality of sub-pixels include the green-light sub-pixel, the blue-light sub-pixel, and the red-light sub-pixel, and an overlapping area of the color filter and the light emitting region of the light emitting element of the green-light sub-pixel is less than an overlapping area of the color filter and the light emitting region of the light emitting element of the blue-light sub-pixel; and the color filter of the green-light sub pixel does not cover an entirety of the light emitting region of the light emitting element of the green-light sub-pixel but covers a center of the light emitting region of the light emitting element of the green-light sub-pixel, and the color filter of the blue-light sub-pixel does not cover an entirety of the light emitting region of the light emitting element of the blue-light sub-pixel but covers a center of the light emitting region of the light emitting element of the blue-light sub-pixel, and the color filter of the red-light sub-pixel covers an entirety of the light emitting region of the light emitting element of the red-light sub-pixel.

2. The display substrate according to claim 1, further comprising a black matrix provided between different sub-pixels of the plurality of sub-pixels, wherein the light emitting region is provided in a region defined by the black matrix, and, in at least one of the at least two of the plurality of sub-pixels, the color filter at least partially overlaps a boundary of the light emitting region in a direction perpendicular to the display substrate.

3. The display substrate according to claim 1, wherein, in at least one of the at least two of the plurality of sub-pixels, a lateral dimension of the color filter is not smaller than a lateral dimension of the light emitting region of the light emitting element.

4. The display substrate according to claim 1, wherein, in at least one of the at least two of the plurality of sub-pixels a longitudinal dimension of the color filter is not smaller than a longitudinal dimension of the light emitting region of the light emitting element.

5. The display substrate according to claim 1, wherein, in at least one of the at least two of the plurality of sub-pixels, the color filter covers at least two boundaries opposite to each other in a lateral direction of the light emitting region of the light emitting element.

6. The display substrate according to claim 1, wherein, in at least one of the at least two of the plurality of sub-pixels, the color filter at least covers two boundaries, opposite to each other in a longitudinal direction of the light emitting region, of the light emitting region of the light emitting element.

7. The display substrate according to claim 1, wherein the overlapping area of the color filter and the light emitting region of the light emitting element of the blue-light sub-pixel is less than an overlapping area of the color filter and the light emitting region of the light emitting element of the red-light sub-pixel.

8. The display substrate according to claim 1, comprising a circuit layer, wherein the circuit layer comprises a switching thin film transistor, a driving thin film transistor, and a storage capacitor, and the circuit layer is electrically connected with the light emitting element so as to drive the light emitting element to emit light.

9. The display substrate according to claim 8, wherein
the lower electrode is provided between the circuit layer and the upper electrode in a direction perpendicular to the display substrate; and
the display substrate further includes a reflective layer provided between the lower electrode and the circuit layer and including a metal material.

10. The display substrate according to claim 8, wherein
the lower electrode is provided between the circuit layer and the upper electrode in a direction perpendicular to the display substrate; and
a side of the upper electrode facing away from the circuit layer is covered with an insulating layer.

11. The display substrate according to claim 1, further comprising a peripheral metal for connecting the display substrate to an external signal source, wherein the peripheral metal comprises copper.

12. The display substrate according to claim 1, wherein an area of the color filter of the green-light sub-pixel is less than an area of the color filter of the blue-light sub-pixel.

13. The display substrate according to claim 12, wherein the area of the color filter of the blue-light sub-pixel is less than an area of the color filter of the red-light sub-pixel.

14. The display substrate according to claim 1, wherein a transmittance of the color filter of the blue-light sub-pixel is less than a transmittance of the color filter of the green-light sub-pixel.

15. A display panel comprising the display substrate according to claim 1.

16. A display device comprising the display panel according to claim 15.

17. The display substrate according to claim 2, wherein, in at least one of the at least two of the plurality of sub-pixels, the black matrix is further provided between a region where the color filter is provided and a region where the color filter is not provided, so as to define a color filter (CF) covering region and a non-CF region in the light emitting region of the light emitting element of the at least one of the at least two of the plurality of sub-pixels.

* * * * *

UNITED STATES PATENT AND TRADEMARK OFFICE
CERTIFICATE OF CORRECTION

| | | |
|---|---|---|
| PATENT NO. | : 11,778,880 B2 | Page 1 of 1 |
| APPLICATION NO. | : 17/307573 | |
| DATED | : October 3, 2023 | |
| INVENTOR(S) | : Yuan et al. | |

It is certified that error appears in the above-identified patent and that said Letters Patent is hereby corrected as shown below:

In the Claims

Column 13, Claim 1, Line 7:
Delete "the color filter has a solid structure; without any opening" and insert --the color filter has a solid structure without any opening-- therefor Signed and Sealed this
Twenty-third Day of April, 2024

Katherine Kelly Vidal
*Director of the United States Patent and Trademark Office*